(12) United States Patent
Lu (10) Patent No.: US 7,812,676 B2
(45) Date of Patent: Oct. 12, 2010

(54) LOW VOLTAGE INPUT STAGE

(75) Inventor: Ye Lu, Reading, MA (US)

(73) Assignee: Analog Devices, Inc., Norwood, MA (US)

(*) Notice: Subject to any disclaimer, the term of this patent is extended or adjusted under 35 U.S.C. 154(b) by 40 days.

(21) Appl. No.: 11/613,682

(22) Filed: Dec. 20, 2006

(65) Prior Publication Data

US 2007/0159252 A1    Jul. 12, 2007

Related U.S. Application Data

(60) Provisional application No. 60/754,554, filed on Dec. 28, 2005.

(51) Int. Cl.
*H03F 3/04* (2006.01)

(52) U.S. Cl. .................. 330/311; 330/258; 330/136

(58) Field of Classification Search ............ 330/253, 330/258, 311, 136
See application file for complete search history.

(56) References Cited

U.S. PATENT DOCUMENTS

| | | | |
|---|---|---|---|
| 6,642,788 B1* | 11/2003 | Abughazaleh | 330/253 |
| 2005/0104539 A1* | 5/2005 | Crandall et al. | 315/276 |
| 2006/0119429 A1* | 6/2006 | Lim | 330/253 |

* cited by examiner

*Primary Examiner*—Michael B Shingleton
(74) *Attorney, Agent, or Firm*—Sunstein Kann Murphy & Timbers LLP (57) ABSTRACT

A transconductance input apparatus energized by supply voltage has an input for receiving an input signal, and an output for delivering an output signal. The apparatus also has a plurality of transconductance stages for converting the input signal into the output signal, which is substantially free of dead zones when the total supply voltage is 2.7 volts or less.

15 Claims, 6 Drawing Sheets

LOW VOLTAGE INPUT STAGE

PRIORITY

This patent application claims priority from provisional U.S. patent application No. 60/754,554, filed Dec. 28, 2005, entitled, "Low Voltage Rail-to-Rail Bipolar Input Stage," and naming Ye Lu as inventor, the disclosure of which is incorporated herein, in its entirety, by reference.

FIELD OF THE INVENTION

The invention generally relates to input stages for electronic circuits and, more particularly, the invention relates to low voltage input stages for electronic circuits.

BACKGROUND OF THE INVENTION

Figure 1:
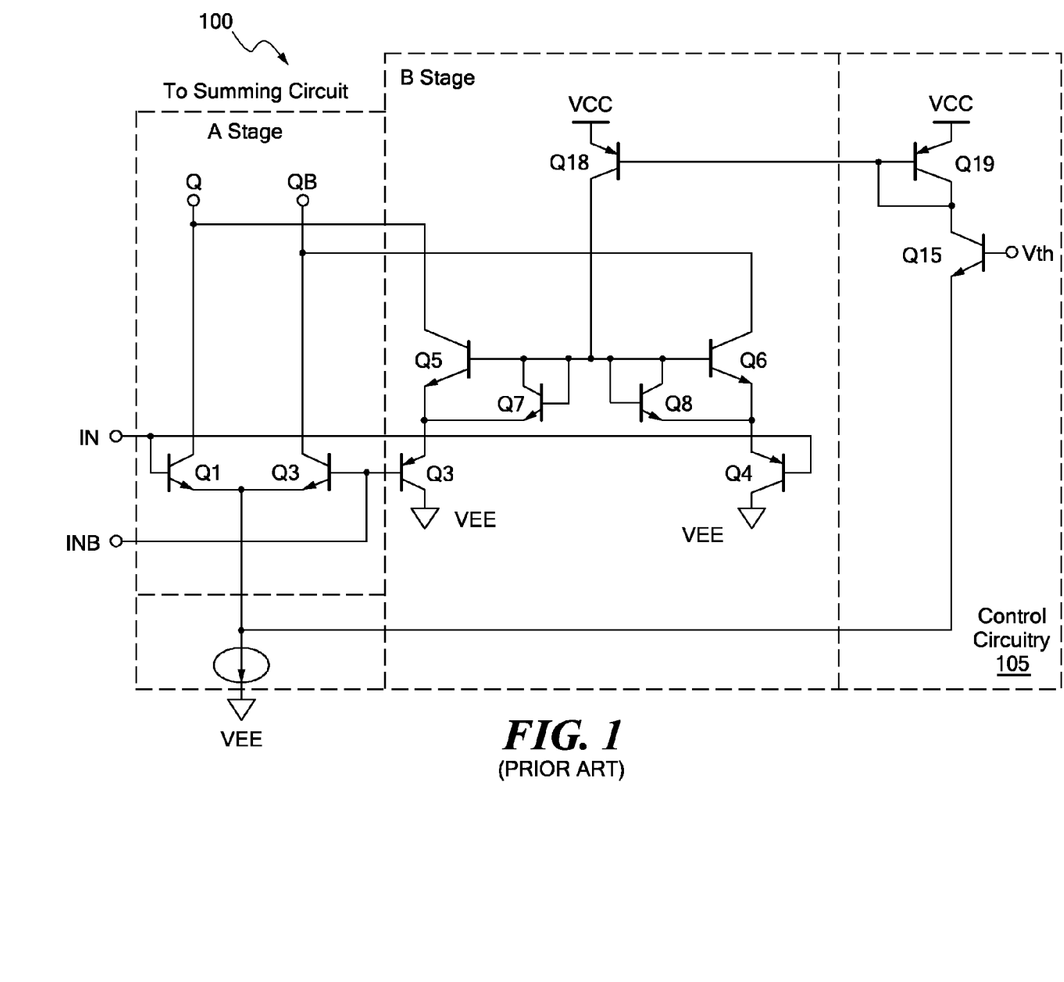
FIG. 1 schematically shows a conventional input stage, which has two stages: a PNP stage that turns on at a first time (A stage), and an NPN stage that turns on when the PNP stage turns off (B stage)

FIG. 1 schematically shows a conventional rail-to-rail input stage 100, which has two stages: an NPN stage (Q1, Q2) that turns on at a first time (A stage), and a PNP stage (Q3-Q8) that turns on when the NPN stage turns off (B stage). As known by those skilled in the art, the input stage should have a substantially constant small signal transconductance gain (gm) to ensure that an appropriate signal is forwarded to a subsequent stage. To achieve a constant transconductance gain, the two stages are switched so that as the NPN stage begins to shut down, the PNP stage begins to become active, and vice versa. For example, the NPN A stage may be active when the common mode input voltage approaches the positive rail voltage. Conversely, the PNP B stage may be active when the common mode input voltage approaches the negative rail voltage. To smoothly effectuate this switch at higher total supply voltages (i.e., greater than about three volts), a switch transistor Q15 (control circuitry 105) steers a tail current between the two stages as a function of the input common mode voltage. This tail current is switched using a current mirror formed by Q19 and Q18.

Figure 2:
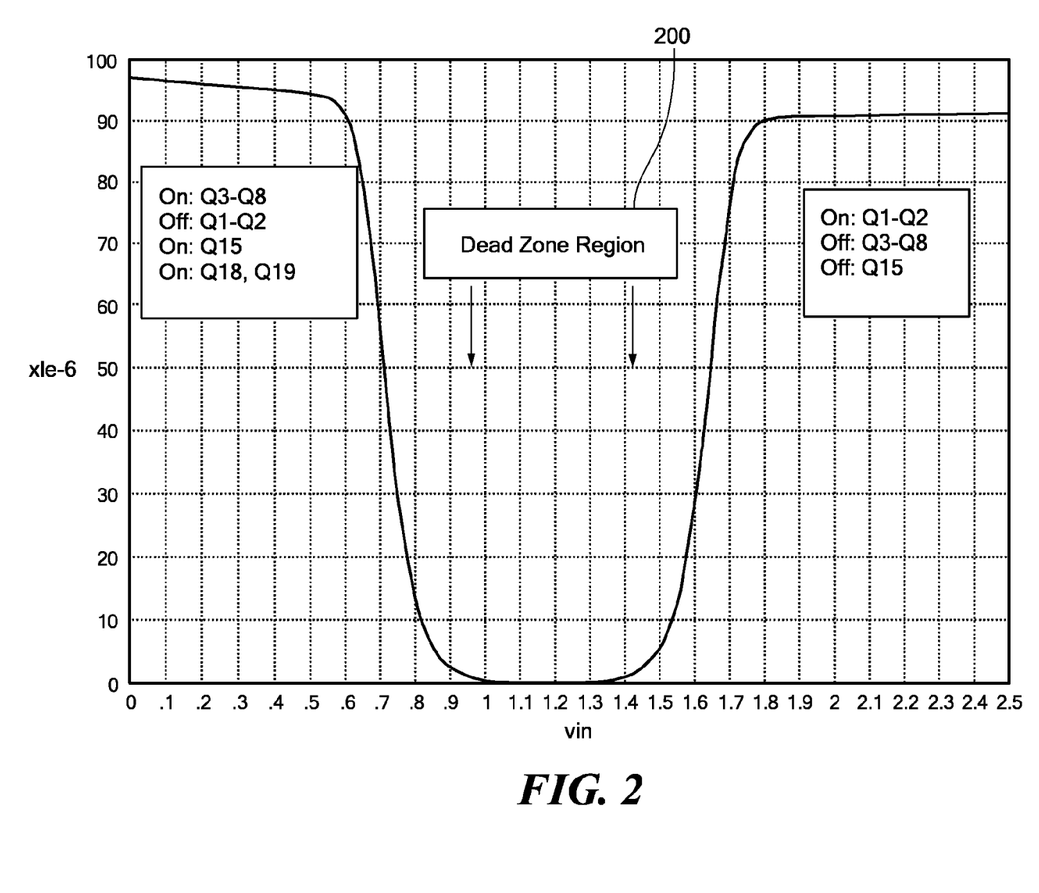
FIG. 2 shows a graph of the voltage versus the transconductance for the prior art input stage of FIG. 1 that exhibits a dead zone when transitioning between its (A stage) and (B stage)

Problems arise, however, when making the transition between stages at lower total supply voltages. At lower total supply voltages, the PNP stage begins to turn off much earlier than the NPN stage turns on, i.e., the PNP stage turns off, for example as shown in FIG. 1 at VCC-3 Vbe (approximately 0.7V) while the NPN stage of FIG. 1 still has to wait for a voltage of about 2 Vbe (1.4 V) to become active. This phenomenon undesirably causes a "dead zone" region 200 at about the middle of the input range, which is shown by example in FIG. 2. In the dead zone region 200 for voltage changes there is no current output and therefore the gain is zero. Accordingly, if the input stage is used as an input stage for a comparator or an operational amplifier, for example, the second stage of said comparator or amplifier will not function properly because it is not receiving a proper input signal

SUMMARY OF THE INVENTION

In accordance with one embodiment of the invention, a transconductance input apparatus energized by a total supply voltage of about 2.7 volts or less has an input for receiving an input signal, and an output for delivering an output signal. The apparatus also has a plurality of transconductance stages for converting the input signal into the output signal, which is substantially free of dead zones when the total supply voltage is 2.7 volts or less.

Among other things, the plurality of transconductance stages may have a first stage that operates when the input signal is at a first level, a second stage that operates when the input signal is at a second level, and a third stage that operates when the input signal is at a third level. The first level illustratively is less than the second level, while the second level illustratively is less than the third level.

Moreover, the input signal may be a voltage signal and the output signal is a current signal. In some embodiments, the plurality of transconductance stages has a substantially constant transconductance. The apparatus also may have a steering component that permits no more than one of the plurality of stages to be fully on at a given time.

To provide a desired output, the input may be directly connected to each of the plurality of stages. The plurality of stages also may have a first stage that turns on at a first voltage, and a second stage that turns on at about 0.6 to 0.8 volts above the first voltage.

In accordance with another embodiment of the invention, a transconductance input apparatus energized by supply voltage has an input for receiving an input signal, and an output for delivering an output signal that is substantially free of dead zones when the total supply voltage is about 2.7 volts or less. The apparatus also has transconductance conversion circuitry for converting the input signal into the output signal.

In accordance with other embodiments of the invention, a method of transconducting a signal provides conversion circuitry, energizes the conversion circuitry with a total supply voltage of 2.7 volts or less, and receives an input signal. The conversion circuitry converts the input signal into an output signal that is substantially linearly related to the input signal and free of a dead zone.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Figure 3A:
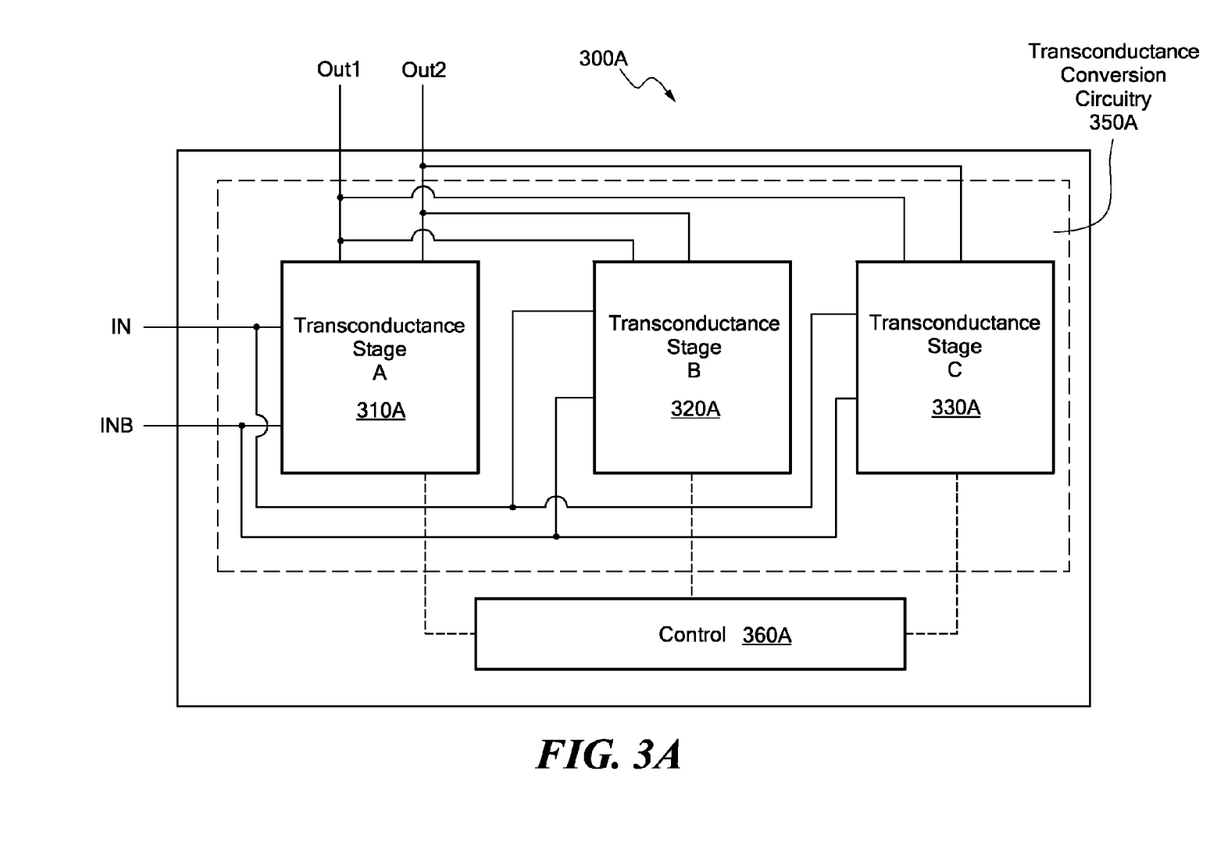
FIG. 3A shows a block diagram of an embodiment of a rail-to-rail input stage.

FIG. 3A shows a block diagram of an embodiment of a rail-to-rail input stage 300. The rail-to-rail input stage 300A includes a plurality of inputs IN and INB. The inputs may be either a single ended or differential voltage signal. The input stage 300A includes a plurality of transconductance stages 310A, 320A, 330A. In the embodiment that is shown there are three transconductance stages. Each of the plurality of inputs IN and INB is electrically coupled to each of the transconductance stages 310A, 320A, and 330A. The input stage 300A also includes a plurality of outputs (OUT1, OUT2) that provide a current output signal. The current output signal is differential. The plurality of outputs (OUT1, OUT2) is also electrically coupled to each of the transconductance stages 310A, 320A, and 330A. The plurality of transconductance stages 310A, 320A, 330A form transconductance conversion circuitry 350A. During operation the transconductance conversion circuitry produces an output signal from the input signal that exhibits a substantially constant small signal transconductance gain even when the total supply voltage level is at or below 2.7 Volts. Each of the transconductance stages A,B,C operates within a separate common mode input voltage range and only one of the transconductance stages is fully-on at a time. A stage is fully on when the transistors are forward biased. Control circuitry 360A assists with the transition between each stage. Thus, each of the stages has a defined range common mode input voltage range, but the ranges may overlap. The input stage of FIG. 3A does not experience an input voltage range wherein the output current goes substantially to zero. Thus, the circuitry operates with low total supply voltages (~2.7V or less) while maintaining a substantially constant transconductance gain.

Figure 3B:
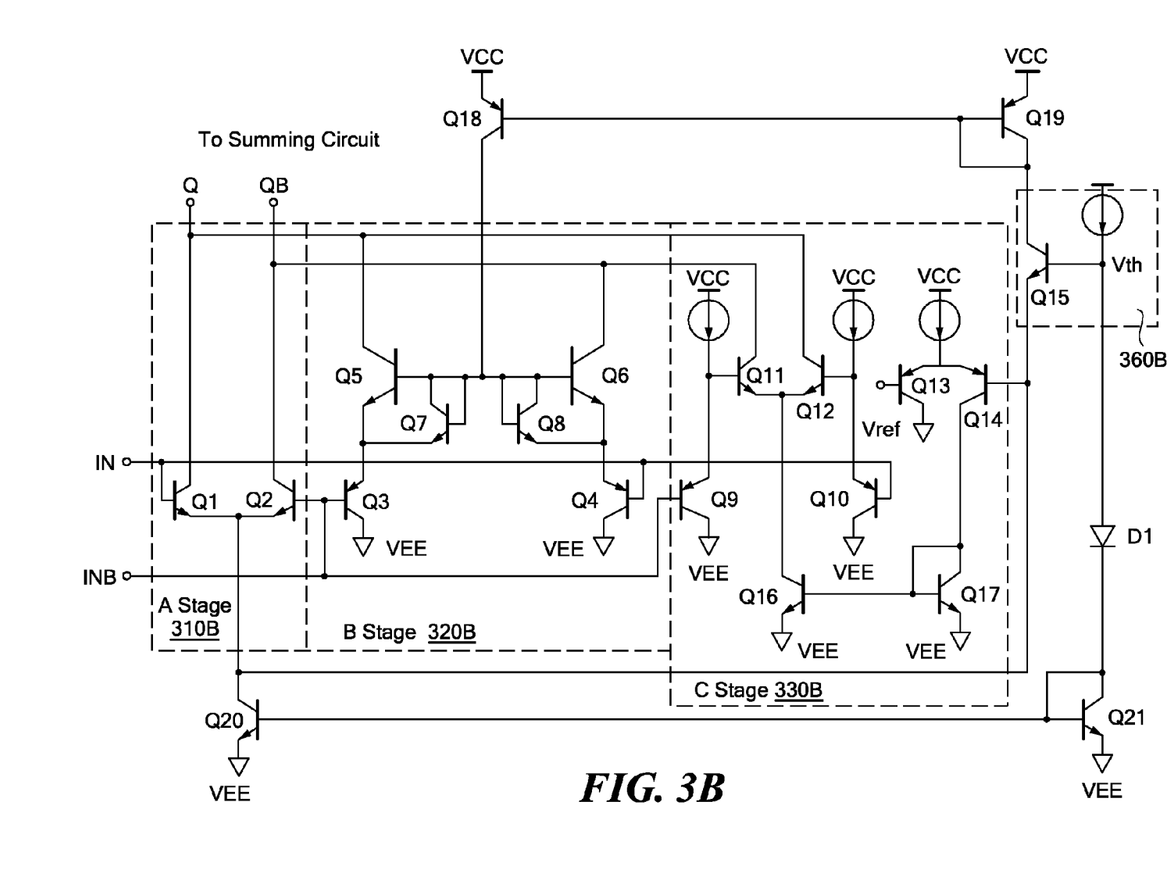
FIG. 3B schematically shows an improved rail-to-rail input stage having a C stage that helps to minimize the dead zone during transitions between the A stage and the B stage.

FIG. 3B schematically shows an improved rail-to-rail input stage 300B having a C stage 330B that helps to minimize the dead zone during transitions between an NPN A stage 310B and a PNP B stage 320B. The C stage 330B includes an NPN bipolar transistor pair (Q11, Q12) for which the base voltage of the transistor pair is one Vbe greater than that of the NPN transistor pair (Q1, Q2) of the A stage 310B. The input stage 300B includes commonly shared input terminals IN and INB. These input terminals are coupled to each of the three stages: A stage 310B, B stage 320B, and C stage 330B. Similarly, the input stage 300B includes outputs Q and QB. As with the inputs, these outputs are commonly shared between A stage 310B, B stage 320B and C stage 330B.

The rail-to-rail input stage as shown operates over five ranges of operation. When the input common mode voltage is low (near the rail voltage VEE), the B stage's PNP transistor pair (Q5, Q6) are fully operational so that the transconductance gain of the B stage is substantially constant, and the A and C stages are off. A stage is fully-on when the stage is the only stage supplied with operating current. Stage A is off because current source Q20 is saturated and transistors Q1 and Q2 are off because the base emitter voltage (Vbe) for the transistors Q1 and Q2 is below the turn-on threshold for the transistors. C stage is off because Q16 is saturated and therefore, no operating current is available for Q11 and Q12. Thus, only the B stage contributes to the output in this region of operation.

At approximately one Vbe common mode voltage, the rising voltage at the emitters of Q1 and Q2 causes Q15 to being shutting down and current to decrease through the current mirror including Q18. As a result, B stage begins to turn off. A stage remains off because Q20 is still saturated. C stage begins to turn on because Q16 comes out of saturation and supplies current to Q11 and Q12. Thus, C stage is turning on as B stage is turning off and both the C and B stages contribute to the output in this region of operation.

As the input common mode voltage continues to rise to approximately twice the Vbe turn-on voltage for the transistors, C stage is fully operational and B stage is fully off because the rising voltage at the emitters of Q1/Q2 causes Q15 to turn off completely. A stage remains off, since the voltage across the base-emitter junctions of Q1 and Q2 has not reached its turn-on threshold. Thus, only C stage contributes to the output in this region of operation.

As the common mode input voltage increases further, C stage begins to shut down, since Q14 starts to turn off. As Q14 turns off, the current in Q16 decreases. A stage begins to turn on, since the voltage at the emitters of Q1 and Q2 continues to rise and Q20 starts to turn on coming out of saturation. Thus, both the C and A stages contribute to the output in this region of operation.

Finally, as the common mode voltage approaches the rail voltage VCC, A stage is on and B and C stages are off. The voltage at the emitters of Q1 and Q2 increases to a level that causes Q14 to shut off. The Vbe for Q1 and Q2 has reached the turn-on threshold so that Q1 and Q2 are operational and Q20 is forward biased. Thus, only the A stage contributes to the output in this region of operation.

The rail-to-rail input stage 300B operates in the following manner. An input voltage is provided at inputs IN and INB. The input voltage may be differential in some embodiments and single-ended in other embodiments. For example, if the input stage is used as an input stage for a comparator, the input voltages would operate in differential mode. If the input stage is used as the input stage for an operational amplifier, the input voltage would be single ended, wherein the second terminal would be tied to a known voltage, such as ground.

In order to assist in the transition between the A stage and the B stage control circuitry 360B is provided. Transistor Q15 operates as a control transistor for guiding the tail currents between the A stage and the B stage. If the common mode voltage of inputs IN and INB is above a threshold voltage level so that the voltage at the emitters of Q1 and Q2 causes Q15 to shut off, the B stage is off and the A stage is on. The threshold voltage is defined by the Vbe of control transistor Q15, which is dictated by the process being used along with the voltage Vth. When Q15 is off, no current passes through Q15 and no current is mirrored by Q19 through Q18. As a result, stage B (Q3-Q8) is off and does not contribute to the output current. Similarly, when the common mode input voltage is high, current steering switch as defined by Q13 and Q14 (which may be considered part of control circuitry 360B) causes the current source shared by the transistors to be steered to ground, since Vref is greater than Vb of Q14 will be no current if Vb of Q14 is greater than Vref. As a result, no current is directed through Q14 and mirrored in Q16 by Q17. Therefore, Q11 and Q12 are off and no current is provided to the output by Stage C and only stage A contributes to the output.

As the common mode input voltage drops, the A Stage 310B begins to shut down and the voltage at the emitters of Q1 and Q2 falls. As this voltage falls, Q14 becomes dominant in the current steering circuit (Q13 and Q14) and current begins to flow through Q14. When current flows through Q14, the current is mirrored by Q17 through Q16. Thus, stage C 330B is active. Because Q11 and Q12 are one Vbe higher than the voltage of the bases of Q1 and Q2, Q11 and Q12 remain operational as Q1 and Q2 become inactive. During this input voltage range, stage B continues to be off, since Vth-Ve is not greater than the threshold voltage for Q15 and therefore Q15 remains off. Thus, Q18 does not receive any current.

As the common mode input voltage drops further (into the dead zone region of FIG. 2), Stage A 310B eventually shuts down completely when Q20 is saturates. Stage C 330B becomes fully operational through the dead zone region of FIG. 2 and thus, unlike the dead zone region of FIG. 2, there is an output current and a substantially constant transconductance gain. Again, stage B 320B remains in an off state due to the voltage Vbe of Q15 not exceeding the voltage threshold for the transistor to turn on, since Q20 is saturated. When Q20 is saturated the base voltage for Q15 is lower than the emitter voltage.

Finally, when input common mode voltage falls to near the voltage rail VEE. The Vbe for Q11 and Q12 falls and the transistors begin shutting down. It should be noted that A stage 310B continues to remain shut down since the Vbe of Q1 and Q2 is below the turn-on threshold and Q20 remains in saturation. As Q11 and Q12 shut down, the emitter voltage of Q15 begins to fall. The Vbe of Q15 increases above the turn-on threshold and this allows current to flow through Q15. As current flows through Q15, the current is mirrored in Q18. With this tail current, Stage B becomes operational, such that PNP transistors Q3 and Q4 produce current at their emitters and this current contributes to the output current. When, Q11 and Q12 are fully off, C stage 330B does not output any current, and only stage B 320B is operational and contributes to the output current.

It should be noted that VEE and VCC are not limited to any particular values. The circuitry of the present invention produces a substantially constant transconductance gain when the total supply voltage becomes 2.7V or less regardless of the values of VEE and VCC.

Figure 4:
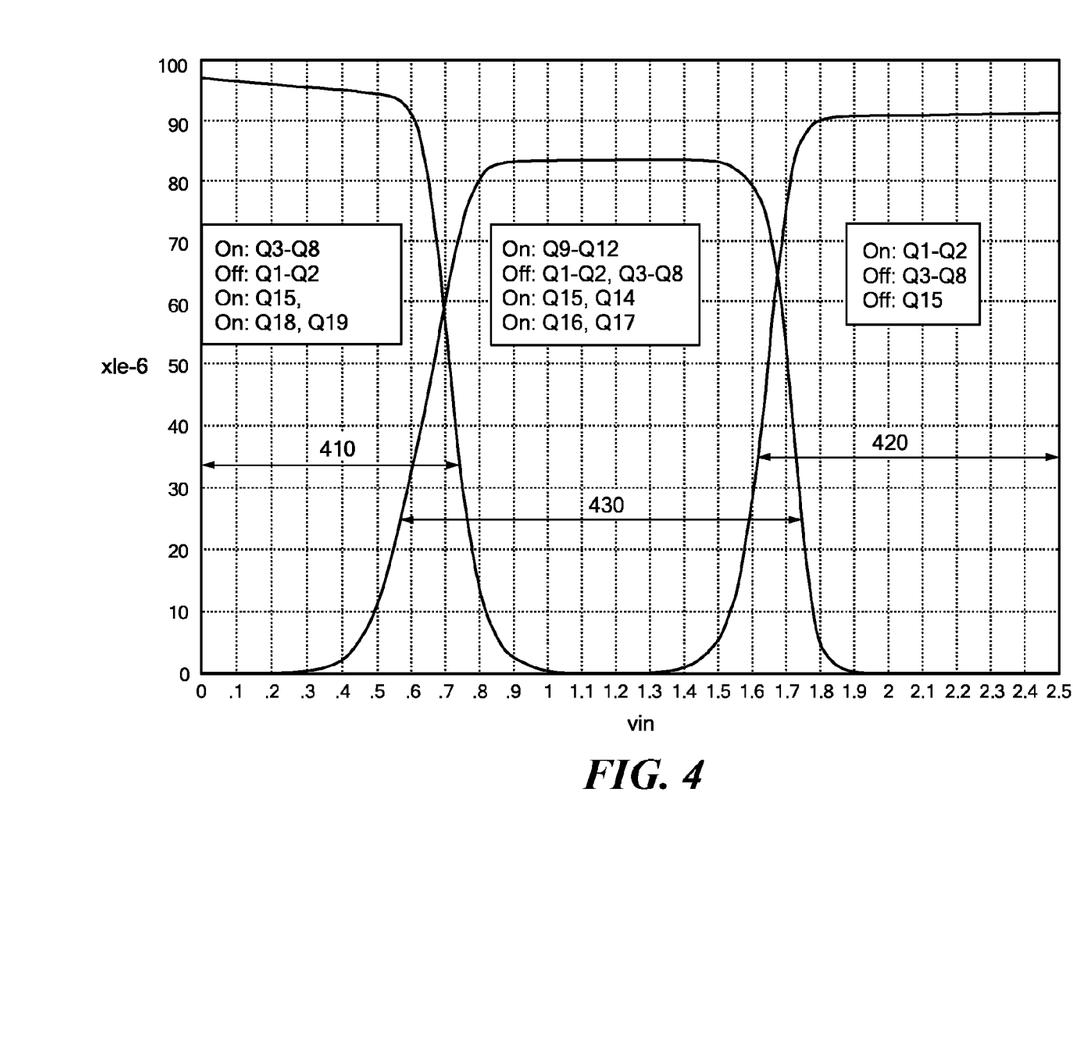
FIG. 4 shows a graph of the voltage versus the current for the input stage of FIG. 3 wherein the dead zone is substantially reduced by the presence of the C stage.

FIG. 4 shows a graph of the voltage versus the current for the input stage of FIG. 3 wherein the dead zone (decrease in current to near zero) is substantially reduced by the presence of the C stage. The C stage allows the input stage to exhibit a nearly constant transconductance gain over voltage levels between rails VEE and VCC. As shown in FIG. 4. Stage B is operational when the common mode input voltage is near the negative voltage rail 410. Stage C becomes active and is active when Stage B is turning off, when neither stage A or B is on, and when Stage A begins to turn on 430. Stage A only turns on when the common mode voltage approaches the positive rail voltage VCC 420.

Figure 5:
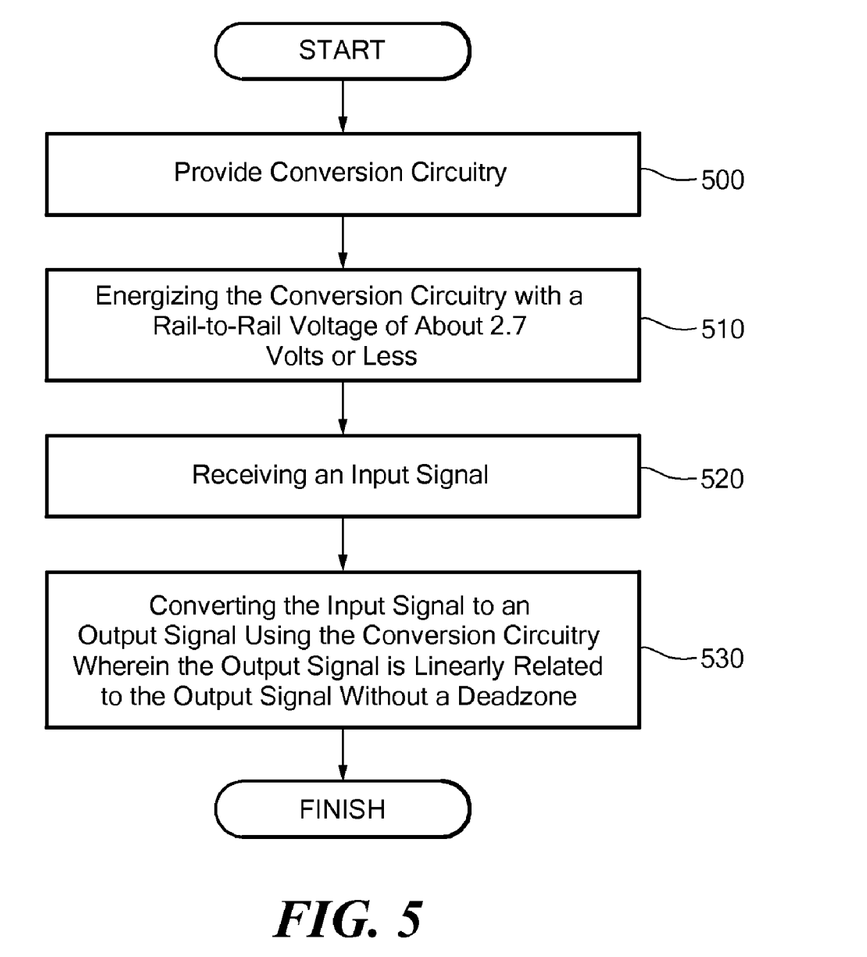
FIG. 5 is a flow chart showing one method for implementing the present invention.

FIG. 5 shows a flow chart for implementing one embodiment of the present invention. First, conversion circuitry is provided for providing transconductance amplification 500. The conversion circuitry includes a plurality of circuit stages. The conversion circuitry is provided with a total supply voltage of approximately 2.7 volts or less 510. An input signal is provided to the stages of the conversion circuitry 520. In response to the input signal, the stages of the conversion circuitry produce an output signal that is linearly related to the input signal and is free of any dead zones, so that the transconductance gain is substantially constant 530. During operation, the plurality of stages is controlled by a control stage. The control stage prevents any one of the stages from being fully active at the same time as another conversion stage. In certain embodiments, there are three conversion stages, wherein each stage has an input voltage operating range. The voltage operation ranges of the conversion stages may overlap.

Although the above discussion discloses various exemplary embodiments of the invention, it should be apparent that those skilled in the art can make various modifications that will achieve some of the advantages of the invention without departing from the true scope of the invention.

What is claimed is:

1. A bipolar transistor transconductance input apparatus energized by a supply voltage, the input apparatus comprising:
    three differential bipolar transistor transconductance stages each stage including a controllable tail current source producing a tail current, each stage having an electrically coupled input receiving an input voltage signal, the three differential bipolar transconductance stages converting the input voltage signal into an output current signal at an electrically coupled output, the transconductance stages permitting the transfer function between the input voltage signal and the output current signal to be substantially free of dead zones when the total supply voltage is about 2.7 volts or less; and
    control circuitry for guiding the tail currents so that when a stage is fully-on a tail current is supplied to that stage and the other two stages do not receive tail currents.

2. The input apparatus as defined by claim 1 wherein the three differential bipolar transistor transconductance stages comprises:
    a first differential bipolar transistor stage that operates when the input signal is within a first voltage range;
    a second differential bipolar transistor stage that operates when the input signal is within a second voltage range; and
    a third differential bipolar transistor stage that operates when the input signal is within a third voltage range, the first range partially overlapping with the second range and the second range partially overlapping with the third range.

3. The input apparatus as defined by claim 1 wherein the bipolar transistor transconductance stages produce a substantially constant transconductance gain.

4. The input apparatus as defined by claim 2 wherein the first bipolar transistor transconductance stage turns on at a first voltage, and a second stage turns on at about 0.6 to 0.8 volts above the first voltage.

5. A method of transconducting a signal, the method comprising:
    providing bipolar transconductance conversion circuitry the bipolar transconductance circuitry including three bipolar transconductance stages having electrically coupled inputs and an electrically coupled output, each transconductance stage including a controllable tail current source producing a tail current and control circuitry;
    energizing the conversion circuitry with a total supply voltage of about 2.7 volts or less;
    receiving an input voltage signal; and
    the bipolar transconductance conversion circuitry converting the input voltage signal into an output current signal, the output signal being substantially linearly related to the input signal and being free of a dead zone wherein the control circuitry switches the controllable tail current sources of the three bipolar transconductance stages so that when a stage is fully-on only that stage is provided with a tail current.

6. The method as defined by claim 5 wherein the three bipolar transconductance stages comprises a first stage that turns on at a first voltage, and a second stage that turns on at about 0.6 to 0.8 volts above the first voltage.

7. The method as defined by claim 5 wherein the input signal is a differential input signal.

8. The method as defined by claim 5 wherein the circuitry comprises:
    a first bipolar transconductance stage that operates when the input signal is within a first voltage range;
    a second bipolar transconductance stage that operates when the input signal is within a second voltage range; and
    a third bipolar transconductance stage that operates when the input signal is within a third voltage range, the first voltage range being less than the second voltage range, the second voltage range being less than the third voltage range.

9. The input apparatus as defined by claim 2, wherein the first bipolar transistor stage include an NPN transistor pair and the second bipolar transistor stage includes a PNP transistor pair and wherein the third bipolar transistor pair substantially maintains the gain of the input apparatus while the NPN and PNP transistor pairs are not conducting.

10. The input apparatus defined by claim 9 wherein the third bipolar transistor stage includes an NPN bipolar transistor pair and wherein the base voltage of the third bipolar transistor stage is at least one base emitter voltage level greater than the base voltage of the first bipolar transistor pair.

11. The method according to claim 8 wherein the first bipolar transconductance stage is fully on and the second and third bipolar transconductance stages are non-conducting during a portion of the first voltage range.

12. The method according to claim 11 wherein during a portion of the second voltage range, the first and second bipolar transconductance stages are partially on and the third bipolar transconductance stage is non-conducting.

13. The method according to claim 12 wherein the bipolar transistor pair of the third bipolar transconductance stage is saturated during the portion of the second voltage range.

14. The input apparatus as defined by claim 2, wherein the first bipolar transistor stage include an PNP transistor pair and the second bipolar transistor stage includes a NPN transistor pair and wherein the third bipolar transistor pair substantially maintains the gain of the input apparatus while the PNP and NPN transistor pairs are not conducting.

15. The input apparatus defined by claim 14 wherein the third bipolar transistor stage includes an PNP bipolar transistor pair and wherein the base voltage of the third bipolar transistor stage is at least one base emitter voltage level greater than the base voltage of the first bipolar transistor pair.

* * * * *